(12) United States Patent
Mahler et al.

(10) Patent No.: US 7,705,472 B2
(45) Date of Patent: Apr. 27, 2010

(54) SEMICONDUCTOR DEVICE WITH SEMICONDUCTOR DEVICE COMPONENTS EMBEDDED IN A PLASTIC HOUSING COMPOSITION

(75) Inventors: Joachim Mahler, Regensburg (DE); Ralf Wombacher, Maxhutte-Haidhof (DE); Dieter Lachman, Kehlheim (DE); Bernd Betz, Obertraubling/Oberhinkofen (DE); Stefan Paulus, Zeitlarn (DE); Edmund Riedl, Gebelkofen (DE)

(73) Assignee: Infineon Technologies, AG, Neubiberg (DE)

( * ) Notice: Subject to any disclaimer, the term of this patent is extended or adjusted under 35 U.S.C. 154(b) by 460 days.

(21) Appl. No.: 11/612,738

(22) Filed: Dec. 19, 2006

(65) Prior Publication Data

US 2007/0145606 A1 Jun. 28, 2007

(30) Foreign Application Priority Data

Dec. 20, 2005 (DE) .................. 10 2005 061 248

(51) Int. Cl.
*H01L 23/48* (2006.01)
*H01L 23/52* (2006.01)
*H01L 29/40* (2006.01)

(52) U.S. Cl. ................ 257/783; 257/787; 257/E23.116
(58) Field of Classification Search ................ 257/783, 257/787, E23.116
See application file for complete search history.

(56) References Cited

U.S. PATENT DOCUMENTS

| | | | |
|---|---|---|---|
| 4,364,731 A | 12/1982 | Norling et al. | |
| 5,122,858 A | 6/1992 | Mahulikar et al. | |
| 5,205,036 A | 4/1993 | Yamazaki | |
| 5,554,569 A | 9/1996 | Ganesan et al. | |
| 5,622,896 A | 4/1997 | Knotter et al. | |
| 5,785,791 A | 7/1998 | Letterman, Jr. et al. | |
| 5,946,556 A * | 8/1999 | Hashizume | 438/126 |
| 6,017,632 A | 1/2000 | Pinnavaia et al. | |
| 6,177,726 B1 | 1/2001 | Manteghi | |
| 6,368,899 B1 | 4/2002 | Featherby et al. | |
| 6,963,125 B2 | 11/2005 | Featherby et al. | |
| 2003/0013235 A1 | 1/2003 | Featherby et al. | |
| 2003/0092557 A1 | 5/2003 | Aichele et al. | |

FOREIGN PATENT DOCUMENTS

| | | |
|---|---|---|
| DE | 4012086 A1 | 6/1991 |
| DE | 10124047 A1 | 11/2001 |
| EP | 0580944 A1 | 2/1994 |

(Continued)

OTHER PUBLICATIONS

XP-002365948.

(Continued)

*Primary Examiner*—Phat X Cao
(74) *Attorney, Agent, or Firm*—Edell, Shapiro & Finnan, LLC (57) ABSTRACT

A semiconductor device includes semiconductor device components, an adhesion promoter structure and a plastic housing composition. The semiconductor device components are embedded in the plastic housing composition with the adhesion promoter structure being disposed between the device components and the housing composition. The adhesion promoter structure includes first and second adhesion promoter layers. The first layer includes metal oxides. The metal oxides being silicates of a reactive compound composed of oxygen and organometallic molecules. The second layer includes at least one polymer.

22 Claims, 5 Drawing Sheets

FOREIGN PATENT DOCUMENTS

| | | |
|---|---|---|
| JP | 04364060 | 12/1992 |
| WO | 9922849 A1 | 5/1999 |
| WO | 0210420 A2 | 2/2002 |
| WO | WO 03063389 A1 | 7/2003 |
| WO | WO 2005071741 A2 | 8/2005 |
| WO | 2006034682 A1 | 4/2006 |

OTHER PUBLICATIONS

XP-002365941.

Tiller, H.J., "Silicoating-technique for the preparation of humidity-resistant metal-polymer joints" INNOVENT e.V., Jena.

Israelachvili, J. et al., "Basic Physics of Interactions Between Surfaces in Dry, Humid, and Aqueous Environments", Proceedings of the First International Symposium on Semiconductor Wafer Bonding: Science, Technology and Applications Sponsor (s) Electrochem. Soc.; INS4459841.

Schulze, S. et al., "Low Temperature Bonding of Silicon Wafers by Sol-Gel Processing", Proceedings of the Second International Symposium on Microstructures and Microfabricated Systems; INS5496228.

Kaiser, W.-D., Rudolf, A., Walther, B., "Investigations of Adhesion and Corrosion Processes of Coated Metals," "Bei Problemen wenden Sie sich bitte an das," Jan. 5, 1995.

XP-002365948, Oct. 2002.

XP-002365941, Sep. 1, 2004.

Tiller, H.J., "Silicoating-technique for the preparation of humidity-resistant metal-polymer joints" INNOVENT e.V., Jena, Oct. 1994.

Israelachvili, J. et al., "Basic Physics of Interactions Between Surfaces in Dry, Humid, and Aqueous Environments", Proceedings of the First International Symposium on Semiconductor Wafer Bonding: Science, Technology and Applications Sponsor (s) Electrochem. Soc.; INS4459841, Oct. 1991.

Schulze, S. et al., "Low Temperature Bonding of Silicon Wafers by Sol-Gel Processing", Proceedings of the Second International Symposium on Microstructures and Microfabricated Systems; INS5496228, Oct. 1995.

* cited by examiner

SEMICONDUCTOR DEVICE WITH SEMICONDUCTOR DEVICE COMPONENTS EMBEDDED IN A PLASTIC HOUSING COMPOSITION

CROSS REFERENCE TO RELATED APPLICATIONS

This application claims priority under 35 U.S.C. §119 to Application No. DE 102005061248.2 filed on Dec. 20, 2005, entitled "Semiconductor Device Comprising Semiconductor Device Components Embedded in Plastic Housing Composition," the entire contents of which are hereby incorporated by reference.

BACKGROUND

A lack of adhesion between the embedded components of a device, in particular between a system carrier and a plastic housing composition, has the effect that moisture accumulates in the boundary layer between the system carrier and the plastic housing composition. The moisture expands abruptly if the semiconductor device is heated from room temperature to temperatures of up to 260° C. within a very short time in the course of soldering onto a printed circuit board. The abrupt expansion of the moisture content consequently gives rise to cracks and/or fractures in the plastic housing of the semiconductor device, which is referred to as the "popcorn effect".

In order to prevent the popcorn effect, it is necessary to prevent the accumulation of moisture in the boundary layer between semiconductor device components and plastic housing composition. The accumulation of the moisture can be reduced by improving the adhesion between the surfaces of the semiconductor device components and the surface of the plastic housing composition. Various approaches for improving the adhesion are known. A method for mechanically roughening the surface of a leadframe is known. The roughened surface enables interlocking with the plastic housing composition and consequently a better adhesion. However, this method is cost-intensive and difficult to carry out.

Another method is known by which the surface regions—to be kept free of a protective film—of electrical connection elements of semiconductor device components of a semiconductor device, within a plastic composition, can be kept free prior to the assembly of the components, in which case the protective film may comprise silicon nitrides, silicon oxides, silicon carbides and/or diamond-like carbon.

An electronic device comprising semiconductor chips and system carriers, and methods for producing the same are known for producing a metallic system carrier comprising an electrodeposited adhesion layer composed of metal oxides, in particular the metals zinc and chromium, with the formation of a dendritic morphology. This device and the production method have the disadvantage that it is possible to produce such a dendritic morphology by electrodeposition exclusively on metallic surfaces, so that the adhesion promoter layer cannot be produced for semiconductor device components, such as system carriers composed of ceramic or printed circuit board material, without prior coating with a short-circuiting but metallically conductive layer.

A metal object that is partly provided with nanopores in a surface section is known and can be used as a connection, a carrying or a conduction component for a semiconductor device. In this case, the nanopores in surface regions of the metal object enhance the adhesion to a plastic housing composition of a semiconductor device. This known object, too, has the disadvantage that an adhesion enhancement can only be effected on surfaces of metals and cannot be used for different materials of semiconductor device components of a semiconductor device.

SUMMARY

The described device relates to a semiconductor device comprising semiconductor device components embedded in plastic housing composition, the surfaces of the semiconductor device components at least partially covered by an adhesion promoter structure. The described methods relate to producing semiconductor devices, system carriers and an adhesion promoter structure.

The invention relates to a semiconductor device including: semiconductor device components, an adhesion promoter structure and a plastic housing composition. The semiconductor device components are embedded in the plastic housing composition with the adhesion promoter structure being disposed between the device components and the housing composition. The adhesion promoter structure includes first and second adhesion promoter layers. The first layer includes metal oxides. The metal oxides being silicates of a reactive compound composed of oxygen and organometallic molecules. The second layer includes at least one polymer.

The above and still further features and advantages of the described device and method will become apparent upon consideration of the following definitions, descriptions and descriptive figures of specific embodiments thereof, wherein like reference numerals in the various figures are utilized to designate like components. While these descriptions go into specific details of the device and method, it should be understood that variations may and do exist and would be apparent to those skilled in the art based on the descriptions herein.

BRIEF DESCRIPTION OF THE DRAWINGS

The device and method are explained in more detail below with reference to exemplary embodiments, where.

DETAILED DESCRIPTION

A semiconductor device comprises semiconductor device components, the semiconductor device components reliably adhering to a plastic housing composition. The reliable adhesion between the plastic housing composition and the different materials of the semiconductor device components including metal, ceramic and other plastic materials is intended to be achieved via an adhesion promoter structure applied to the surface of the components prior to the embedding of the semiconductor device components into the plastic housing composition.

The described device provides a semiconductor device including semiconductor device components embedded in plastic housing composition. The surfaces of the semiconductor device components are at least partially covered by an adhesion promoter structure with nanoporous morphology. The adhesion promoter structure being disposed between the semiconductor device components and the plastic housing composition. The adhesion promoter structure includes two layers. A first adhesion promoter layer with metal oxides of a reactive compound including oxygen and organometallic molecules has an average thickness $D_1$, where $1\ nm \leq D_1 \leq 1\ \mu m$. A second adhesion promoter layer includes one or more polymers. The first adhesion promoter layer is arranged on the semiconductor device components and the second adhesion promoter layer is arranged on the first adhesion promoter layer.

In this context, organometallic molecules are to be understood as organic molecules which have semiconductor elements and/or metal elements as radicals and/or central atoms. In this context, the organometallic molecules also include silanes having corresponding tetravalent semiconductor atoms, such as silicon, instead of the central carbon atom of organic compounds. Metal oxides are also understood to include silicates.

The adhesion promoter structure according to the described device thus has a first, inorganic or mineral adhesion promoter layer and a second, organic adhesion promoter layer. This structure has an advantage that the properties of the two layers may be different in order to enhance the adhesion. The first, inorganic layer has an advantage that inorganic materials provide a stable and reliable adhesion on the metals of a leadframe or system carrier, for example Cu and Ni/NiP, and on the surface of the semiconductor chip, for example Al and $Si_3N_4$.

The second adhesion promoter layer includes at least one polymer and provides a stable and reliable adhesion to the plastic housing composition, e.g., epoxy resin. A combination of an inorganic layer arranged directly on the surfaces of the embedded component of the semiconductor device and a second, organic adhesion promoter layer arranged between the first adhesion promoter layer and the plastic housing composition provides an adhesion promoter composite that leads to an enhanced adhesion of the plastic housing composition to the embedded components of the semiconductor device.

One advantage of this semiconductor device is that the two layers of the adhesion promoter structure can be arranged on all surfaces of semiconductor device components composed of a wide variety of materials, such that a moisture- and corrosion-resistant boundary layer forms between metal surfaces, ceramic surfaces and/or other plastic surfaces of the semiconductor devices and the material of the plastic housing composition, which comprises an epoxy resin, for example. The adhesion promoter structure is therefore not restricted to metallic surfaces, but rather can also be applied on system carriers which constitute a ceramic plate or a printed circuit board with a correspondingly structured metallic coating.

The adhesion promoter structure according to the described device consequently achieves a surface refinement of different materials of semiconductor device components which ensures a high reliability even under extreme moisture loading and thermal cycling of the semiconductor devices.

In one embodiment, the first adhesion promoter layer includes at least one oxide of the elements: Al, B, Ce, Co, Cr, Ge, Hf, In, Mn, Mo, Nb, Nd, Ni, Pb, Pr, Pt, Rb, Re, Rh, Ru, Sb, Sc, Si, Sm, Sn, Sr, Ta, Te, Th, Ti, Tl, Tm, U, V, W, Yb, Zr or Zn, preferably Si. These elements have an advantage that organometallic compounds of these elements are known which are suitable for the formation of an adhesion promoter structure with nanoporous morphology. In this case, by mixing different organometallic starting materials of the elements, it is possible to achieve not only the adhesion promoting properties of the layers produced but also a color differentiation of the adhesion promoter layer from the surface of the semiconductor device components in an advantageous manner. For this purpose, mixtures of different organometallic compounds of the elements presented above can be formed in an advantageous manner by joint combustion in a flame pyrolysis installation.

Preferably, the first adhesion promoter layer produced includes at least one oxide of the group: $Al_2O_3$, $B_2O_3$, $Ce_2O_3$, $CeO_2$, $CoO$, $Co_2O_3$, $Cr_2O_3$, $GeO_2$, $HfO_2$, $In_2O_3$, $Mn_2O_3$, $Mn_3O_4$, $MoO_2$, $Mo_2O_5$, $Nb_2O_5$, $NbO_2$, $Nd_2O_3$, $Ni_2O_3$, $NiO$, $PbO$, $Pr_2O_3$, $Pr_2$, $PtO$, $PtO_3O_4$, $Rb_2O$, $ReO_2$, $ReO_3$, $RhO_2$, $Rh_2O_3$, $RuO_2$, $Sb_2O_4$, $Sb_2O_3$, $Sb_4O_6$, $Sc_2O_3$, $SiO_2$, $Sm_2O_3$, $SnO$, $SnO_2$, $SrO$, $Ta_2O_5$, $Te_2O_5$, $TeO_2$, $ThO_2$, $TeO_3$, $TiO$, $TiO_2$, $Ti_2O_3$, $Tl_2O_3$, $Tm_2O_3$, $UO_2$, $U_3O_8$, $UO_3$, $VO$, $V_2O_3$, $V_2O_4$, $V_2O_5$, $WO_2$, $WO_3$, $Yb_2O_3$, $ZrO_2$ or $ZnO$, preferably $SiO_2$. These oxides have an advantage that they can provide an intensive coupling to metallic surfaces. However, the oxides of the semiconductors, such as $SiO_2$, are also able to form a bonding with a high adhesive strength to printed circuit board surfaces and ceramic surfaces.

In a further embodiment, the adhesion promoter layer includes silicate compounds, in particular nanoscale silicates. A silicate layer has an advantage that silicates can form chemical bonds with a multiplicity of elements and materials, with the result that an application of the silicate also permits the formation of stable silicate structures in the interfaces.

In a further embodiment, the porosity of the adhesion promoter structure increases gradually from a pore-free coating on the surfaces of the semiconductor device components to a nanoporous morphology in the transition region with the plastic housing composition. The gradual increase in the porosity from an initially closed adhesion promoter layer to a nanoporous morphology of the surface affords protection of the surface of the semiconductor device components against interface corrosion in the metal-plastic composite, while the gradual increase in the porosity with the thickness of the adhesion promoter structure intensifies the interlocking with the plastic housing composition. In this case, the material of the adhesion promoter layer forms complex bonds with the polymeric plastic housing composition. Stresses in the interfaces are likewise reduced by virtue of this internal structure of the adhesion promoter structure.

In a further embodiment, the first adhesion promoter layer is a layer applied via pyrolytic deposition, preferably flame pyrolysis. During flame pyrolysis, an organometallic compound of the abovementioned elements is decomposed in a gas/air flame. Methane, butane or propane is preferably used as gas for the gas/air flame. In an optimized flame region, an $MeO_x$ layer is deposited onto the surfaces of the ready mounted semiconductor device components. In this case, Me is understood to mean the semiconductor and/or metal elements specified above. The average layer thickness D that is deposited in this case lies between $1\ nm \leq D \leq 300\ nm$; the average layer thickness D preferably lies between $5\ nm \leq D \leq 40\ nm$. In this case, the heating of the semiconductor device components during coating can be kept at below 100° C. particularly in the case of the preferred variant. The effective flame exposure time of the device components is in this case only within the seconds range.

The second adhesion promoter layer may include, e.g., at least one known polymer. Furthermore, it is possible to use a known method for producing the second adhesion promoter layer.

The polymer of the second adhesion promoter layer includes first terminal groups oriented toward the plastic housing composition and second terminal groups oriented toward the first adhesion promoter layer. The first and second terminal groups are selected such that an enhanced adhesion to the adjacent material is achieved. As a result, a reliable adhesion is realized within the adhesion promoter structure and also between the semiconductor device components and the plastic housing composition.

In one embodiment, the second adhesion promoter layer includes at least one polymer from the group of the polyimides, the polyisocyanates, the polyamidocarboxylic esters of the polyamide-silicone block copolymers, the polyamide imides with silanes in the polymer chain or the polyimide-silicone copolymers with silanes in the copolymer chain.

The second adhesion promoter layer may for example include a fluorinated polyimide and for this purpose a 10 percent by weight solution of a polyimide composed of 2,2-bis[phenyl-3',4'-dicarboxylic anhydride]-1,1,1,3,3,3-hexafluoropropylene and 3,3',5,5'-tetramethyl-4,4'-diamino-diphenylmethane in γ-butyrolactone or N-Methylpyrrolidone (NMP) and cyclopentanone with a weight ratio γ-butyrolactone or NMP:cyclopentanone=1:2 is applied to the semiconductor device prior to the encapsulation process selectively without spraying of the outer connecting pins and of the heat-dissipating plate via a suitable dispensing apparatus in such a way that a layer thickness d, where $0.05 \,\mu m \leq d \leq 5 \,\mu m$, and preferably, where $0.5 \,\mu m \leq d \leq 1.0 \,\mu m$ is realized after the subsequent thermal process.

In an alternative embodiment, the second adhesion promoter layer includes polyamide imide whose acid groups have been condensed with amino groups of a silane, every 2nd to 10th free acid group of the polyamide imide having reacted chemically with an amino group of a silane.

In a further embodiment, the second adhesion promoter layer includes a polyimide amide-silicone copolymer with silanes in the polymer chain, acid groups of the polyamide imide having been condensed with amino groups of a silane and every 2nd to 10th free acid group of the polyamide imide having reacted chemically with an amino group of a silane.

The second adhesion promoter layer may additionally include at least one of the following substances: imidazoles, liquid-crystalline polymers, high-temperature-resistant thermoplastics, phenolic resins, amino resins, siloxanes, unsaturated polyesters, polybenzoxazoles, polybenzimidazoles, epoxides, polyurethanes, polymers with sulfur in the main chain, polymers with sulfur in the side chain.

The second adhesion promoter layer may include, in the main chains and/or side chains, additionally one or more of the following functional groups: sulfone group, mercapto group, amino group, carboxyl group, cyano group, keto group, hydroxyl group, silano group, titano group.

A polymer precursor of the second adhesion promoter layer may include one or more copolymers and/or a polymer precursor may include a mixture composed of two or more polymers.

The second adhesion promoter layer may also include at least one of the following additives or assistants: solvents, adhesion promoters, antioxidants, catalysts, reinforcing fillers, plasticizers, UV stabilizers.

The second adhesion promoter layer may have an average thickness $D_2$, where $100 \,nm \leq D_2 \leq 20 \,\mu m$, and preferably, where $0.5 \,\mu m \leq D_2 \leq 10 \,\mu m$.

In one embodiment, the semiconductor device includes a wiring substrate with a structured metal coating as a semiconductor device component. With the technologies known hitherto, wiring substrates of this type can only be covered with the customary adhesion promoter layers in the region of the structured metal coating, while the insulating surface regions cannot be coated galvanically by the conventional methods unless the risk is taken of a thin, short-circuiting, metallic coating of the entire wiring substrate. However, that is at odds with the purpose and task of such a wiring substrate, which, with the aid of the structured metal coating, is intended to produce connecting lines and conductor tracks between different elements of the semiconductor device. In the case of the adhesion promoter structure according to the described device, both the region of the wiring substrate which is not conductive and the region of the substrate with a structured metal coating may be provided completely and uniformly with an adhesion promoter structure.

In a further embodiment, the semiconductor device includes a ceramic substrate with structured metal layers as a semiconductor device component. Such multilayer ceramic substrates are used for constructing semiconductor devices in radiofrequency technology. In this case, too, it is possible, via the adhesion promoter structure according to the described device, for the ceramic surfaces of the semiconductor device component now also to be completely provided with an adhesion promoter structure.

It is furthermore provided that the semiconductor device includes a printed circuit board with a structured metal coating as a semiconductor device component. In this case, too, regions of the insulating board can be coated with the adhesion promoter structure according to the described device in the same manner as the structured metal coating on the printed circuit board, with the result that an intensive bonding to the plastic housing composition covering the printed circuit board is realized.

A further aspect of the described device relates to a system carrier including a plurality of semiconductor device positions which are arranged one after another and/or one behind another in rows and/or columns. The semiconductor device positions, for receiving semiconductor device components, have a spatial wiring structure with chip pads for semiconductor chips and contact pads for electrical connections to chip contact areas of the semiconductor chip. Selective surfaces of the system carrier are covered with an adhesion promoter layer with nanoporous morphology such that the chip pads and the contact pads are free of the adhesion promoter structure.

The adhesion promoter structure includes two layers. A first adhesion promoter layer with metal oxides of a reactive compound composed of oxygen and organometallic molecules and an average thickness $D_1$, where $1 \,nm \leq D_1 \leq 1 \,\mu m$ and a second adhesion promoter layer includes at least one polymer. The first adhesion promoter layer is arranged on the semiconductor device components and the second adhesion promoter layer is arranged on the first adhesion promoter layer.

The two layers of the adhesion promoter structure inherently correspond in terms of their composition and in terms of their morphology to the adhesion promoter structure as has already been described above in detail for the application on semiconductor device components. The system carrier may accordingly include a ceramic substrate or a wiring substrate with a structured metal coating or a printed circuit board with a structured coating. In all cases the system carrier can be coated selectively with an adhesion promoter structure according to the described device on the surfaces which come into contact with plastic housing composition during the production of the semiconductor devices.

In particular, that is the case if the system carrier includes internal leads with contact pads and chip pads. The contact pads and/or chip pads merge into external leads and are held by a leadframe of the system carrier. In this case, the leadframe may include a lead strip with a multiplicity of semiconductor device positions arranged one behind another.

The surfaces of the internal leads are covered with the adhesion promoter structure whose composition and structure has already been described in detail above. However, the contact pads, the chip pads, the external leads and the leadframe remain free of the adhesion promoter structure. A system carrier of this type is a preliminary product for the production of semiconductor devices and can be produced as a preliminary product by supplier companies in the semiconductor industry. The possibility of surfaces of contact pads, chip pads, external leads and leadframe remaining free can be achieved by various known methods.

In a further embodiment, the system carrier itself includes ultrapure copper and/or a copper alloy, which are advantageous due to their high electrical conductivity.

A method for producing a system carrier for semiconductor devices includes the following method steps. First, structuring a substrate plate including at least one metal surface to form a system carrier. The structuring includes producing a plurality of successive patterns for receiving semiconductor device components in semiconductor device positions. Thereafter, coating the surfaces of the system carrier, which form an interface with a plastic housing composition during the fabrication of semiconductor devices, with a first adhesion promoter layer comprising metal oxides of a reactive compound including oxygen and organometallic molecules and having an average thickness $D_1$, where $1\ nm \leq D_1 \leq 1\ \mu m$. Coating the surfaces of the system carrier, which form an interface with a plastic housing composition during the fabrication of semiconductor devices, with a second adhesion promoter layer including at least one polymer. Thereby, the second adhesion promoter layer is disposed on the first adhesion promoter layer.

The coating of the surfaces of the system carrier with the first adhesion promoter layer may be effected via pyrolytic deposition, preferably flame pyrolysis.

A flame-pyrolytic deposition has an advantage that the abovementioned reaction products arise in a combustion gas stream from which semiconductor oxides and/or metal oxides of the organometallic compound deposit on the surfaces of the system carrier. In principle, this pyrolytic deposition may be effected independently of the material of the surfaces. Consequently, the flame pyrolysis can be applied simply and universally. Since only a very thin layer is to be applied, which preferably has a thickness of between 1 and 40 nm, the material costs are also extremely low. Furthermore, flame pyrolysis has an advantage that the temperature of the surfaces of the semiconductor device components does not increase significantly and, under suitable process conditions, can be kept preferably below 100° C., especially as the surfaces come into contact with the flame of the coating installation only for a few seconds.

In one preferred exemplary embodiment of the described method, for the flame-pyrolytic coating, an organometallic compound of a semiconductor element or of a metal element and an oxygen-containing compound with a combustion gas are fed to a coating installation and semiconductor oxides or metal oxides are deposited as reaction products of the compounds introduced on all sides on the uncovered surfaces of the system carrier. An annular burner is preferably used for the deposition on all sides, the burner producing a flame ring through which the system carrier is led.

A tetramethyl silane and derivatives of tetramethylsilane, preferably tetraethylene silane, which has an empirical formula of $SiC_4H_{12}$, is preferably used as an organometallic molecule. With addition of propane having the empirical formula $C_3H_8$ and oxygen $O_2$, silicates $SiO_x$ are deposited on the surfaces, while the volatile reaction products form carbon dioxide and water and escape.

The second, organic adhesion promoter layer may be deposited as a suspension, solution or polymer precursor. The solution or suspension may be deposited by spraying or dipping. These methods have an advantage that all surfaces of the system carrier are coated in one method. The second adhesion promoter layer is thus applied on the first, inorganic adhesion promoter layer. The system carrier can then be heated with evaporation of the solvents in order to produce the second adhesion promoter layer.

In a further implementation of the method, prior to the coating of the system carrier with the two layers of the adhesion promoter structure, surface regions to be kept free are covered with a protective layer. After coating, the protective layer can advantageously be caused to swell, such that it can be removed with the overlapping adhesion promoter structure at the surface regions to be kept free.

In a further preferred implementation of the method, the surface regions to be kept free are uncovered subsequent to the coating of the surfaces of the system carrier with the two layers of the adhesion promoter structure. In the case of this method, the surface regions on which the adhesion promoter is intended to remain can be protected prior to the uncovering process. The uncovering process may be effected via laser removal or via plasma etching methods.

The first adhesion promoter layer may be deposited with an average thickness $D_1$, where $1\ nm \leq D_1 \leq 300\ nm$, and preferably, where $1\ nm \leq D_1 \leq 40\ nm$. The second adhesion promoter layer may be deposited with an average thickness $D_2$, where $100\ nm \leq D_2 \leq 20\ \mu m$, and preferably, where $0.5\ \mu m \leq D_2 \leq 10\ \mu m$.

A method for producing a plurality of semiconductor devices using a system carrier including a plurality of semiconductor device positions includes the following method steps. The first step involves providing a system carrier including a selectively applied adhesion promoter structure according to one embodiment of the described device on its surfaces. "Selectivity applied" relates to the fact that only the surface regions of the system carrier which are intended to form a boundary layer with a plastic housing composition are covered with an adhesion promoter structure. By contrast, contact pads for electrical connections and/or chip pads for making contact with a semiconductor chip are kept free of the adhesion promoter structure.

The semiconductor device components, such as semiconductor chips, are then applied to a system carrier of this type in the semiconductor device positions with the semiconductor chips being connected to contact pads of the system carrier via electrical connection elements. After all of the semiconductor device components have been applied on the system carrier, the semiconductor device components are embedded into a plastic housing composition. Finally, the system carrier can then be separated into individual semiconductor devices.

In the case of this method, the system carrier itself may be a printed circuit board with a metal structure or a multilayer ceramic plate or a metallic leadframe. The advantage of this method is that the application of the adhesion promoter layers is independent of the material of the semiconductor device components. Thus, metallic flip-chip contacts as well as metallic bonding wires may be pyrolytically provided with an adhesion promoter layer in the same manner as the surfaces of the semiconductor chip and the surfaces of the system carrier.

The application of the second polymer adhesion promoter layer via spraying or dipping is also independent of the material of the semiconductor device component. These methods are particularly advantageous if prior to the embedding of the semiconductor device components into a plastic housing composition, the as yet uncoated surfaces of semiconductor device components are likewise to be coated with the adhesion promoter.

In an alternative method for producing semiconductor devices using a system carrier, it is also possible to use a system carrier which initially has no adhesion promoter layer. In a first step, semiconductor device components, such as semiconductor chips, are applied to the system carrier in semiconductor device positions with the semiconductor chips being connected to contact pads of the system carrier for electrical connections. Thereafter, an adhesion promoter layer is applied to all the surfaces of the semiconductor device components which are intended to be embedded into a plastic housing composition.

First, a first adhesion promoter layer with nanoporous morphology including metal oxides of a reactive compound including oxygen and organometallic molecules and having an average thickness $D_1$, where $1\text{ nm} \leq D_1 \leq 1\text{ }\mu\text{m}$ is applied to all the surfaces of the semiconductor device components which are intended to be embedded into a plastic housing composition. Subsequently, a second adhesion promoter layer including one or more polymers is deposited on the first adhesion promoter layer. The second adhesion promoter layer thus also covers all the surfaces of the semiconductor device components which are intended to be embedded into a plastic housing composition.

All the surfaces of the semiconductor device components which are intended to be embedded into a plastic housing composition thus are covered with an adhesion promoter structure including two layers. The different materials of the component, for example of the metallic bonding wires, of the semiconductor chip and of the metallic leadframe are coated with the two adhesion promoter layers.

After the semiconductor device components are provided with an adhesion promoter layer, the components are embedded into a plastic housing composition.

Finally, the system carrier can be separated into individual semiconductor devices. In the case of this method, it is incumbent upon the semiconductor manufacturer to first to mount the entire semiconductor device components on a conventional carrier substrate and then for the manufacturer itself to apply the adhesion promoter layer to the surfaces of the semiconductor device components. One advantage of this alternative method is that none of the surfaces to be covered with a plastic housing composition are free of an adhesion promoter layer.

In the following paragraphs, exemplary embodiments of the device and method are described in connection with the figures.

Figure 1:
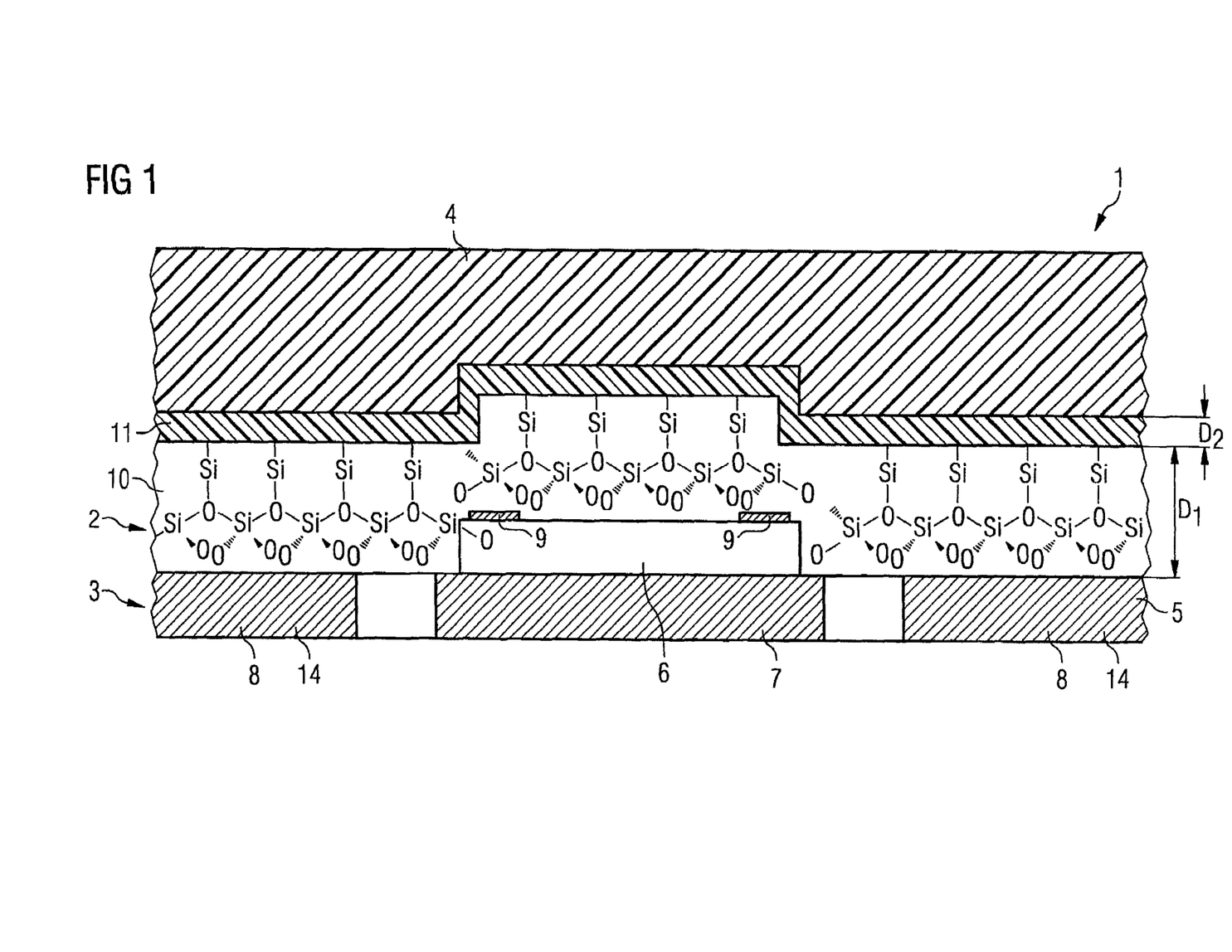
FIG. 1 shows a schematic diagram of a semiconductor device comprising an adhesion promoter structure according to the invention having two layers.

FIG. 1 shows a schematic diagram of a section of a semiconductor device 1 comprising an adhesion promoter layer structure 2 according to the invention. The semiconductor device 1 is not illustrated in a manner true to scale and, in particular, the structure of the adhesion promoter structure 2 is enlarged in order to better elucidate the device.

The semiconductor device 1 comprises a leadframe 5 including a chip island 7 and a plurality of leads 8 surrounding the chip island 7 as a system carrier, and a semiconductor chip 6. The passive rear side of the semiconductor chip 6 is mounted on the chip island 7. The active top side of the semiconductor chip 6 comprises chip contact areas 9, which are electrically connected to the lead 8 via bonding wires (not shown here). The semiconductor chip 6, bonding wires, chip islands 7 and inner regions of the leads 8 form the components 3 of the semiconductor device 3 which are embedded in a plastic housing composition 4.

In this embodiment, first the semiconductor chip 6 is applied on the chip island 7 and the bonding wires are produced. Afterwards, the adhesion promoter layer is applied to the leadframe 5, the semiconductor chip 6 and the bonding wires. All embedded surfaces of the component 3 are coated with the adhesion promoter structure 2 and the adhesion promoter structure 2 is thus arranged on different types of materials. According to the described device, the adhesion promoter structure 2 comprises two layers.

The adhesion promoter structure 2 comprises a first layer 10, which is arranged directly on the embedded components 3 of the semiconductor device 1. In this embodiment, the first layer 10 is arranged on the leadframe 5, the semiconductor chip 6 and the bonding wires. The first layer 10 comprises an inorganic material and, in this embodiment, it essentially comprises silicates. The first adhesion promoter layer 10 has an average thickness $D_1$, which is 250 nm in this embodiment. A first layer 10 made of silicates has the advantage that a good adhesion with the component 3 of the semiconductor device 1 is provided.

The silicates may have a preferred orientation within the adhesion promoter layer 10. As is schematically illustrated in FIG. 1, the O atoms are directed toward the surfaces of the semiconductor chip 6 and of the leadframe 5. The Si atoms are directed toward the second adhesion promoter layer and the plastic housing composition 4.

The first adhesion promoter layer 10 is applied on the surfaces of the component 3 via spraying and a flame-pyrolytic method. Flame-pyrolytic coating has the advantage that electrically conductive and also electrically nonconductive materials can be coated. The different materials of the component 3 of the semiconductor device 1 can thus be coated in one coating method. This method is explained in more detail in conjunction with FIG. 2.

The second adhesion promoter layer 11 is applied on the first layer 10 in order to produce the adhesion promoter structure 2 according to the described device. According to the described device, the second adhesion promoter layer 11 comprises polymers. The second adhesion promoter layer 11 has a thickness $D_2$, which is 10 μm in this embodiment. The components 3 coated with the adhesion promoter structure 2 are subsequently embedded in the plastic housing composition 4. The polymer layer 11 provides a good adhesion with the plastic housing composition 4 and with the first adhesion promoter layer 10 made of silicates.

The second adhesion promoter layer 11 made of polymers is applied to the components 3 in the form of a solution or suspension. The solvent is then evaporated. The second adhesion promoter layer 11 is applied to the components 3, or to the first adhesion promoter layer 10 coating the component 3, via spraying or dipping. This deposition method has the advantage that all the surfaces are coated with the polymer layer simultaneously.

The two-layer adhesion promoter structure 2 according to the described device has the advantage that each layer has different properties. The first adhesion promoter layer 10 exhibits a good adhesion to metals, semiconductors and ceramics and also the second adhesion promoter layer 11 arranged on it. The second adhesion promoter layer 11 exhibits a high adhesion to the plastic housing composition 4 and also to the first adhesion promoter layer 10. For this purpose, according to the described device, the first adhesion promoter layer 10 comprises an inorganic material, in particular silicates, and the second adhesion promoter layer 11 comprises one or more polymers.

In further embodiments of the described device that are not shown, a rewiring substrate and a ceramic substrate are provided as a system carrier. In these embodiments, typically only the top side of the circuit carrier is coated with the adhesion promoter structure 2 since the underside of the substrate is not embedded in the plastic housing composition. Furthermore, the connection elements are not restricted to bonding wires. In a further embodiment that is not shown, the semiconductor chip 6 is electrically connected to the circuit carrier via flip-chip contacts.

Figure 2:
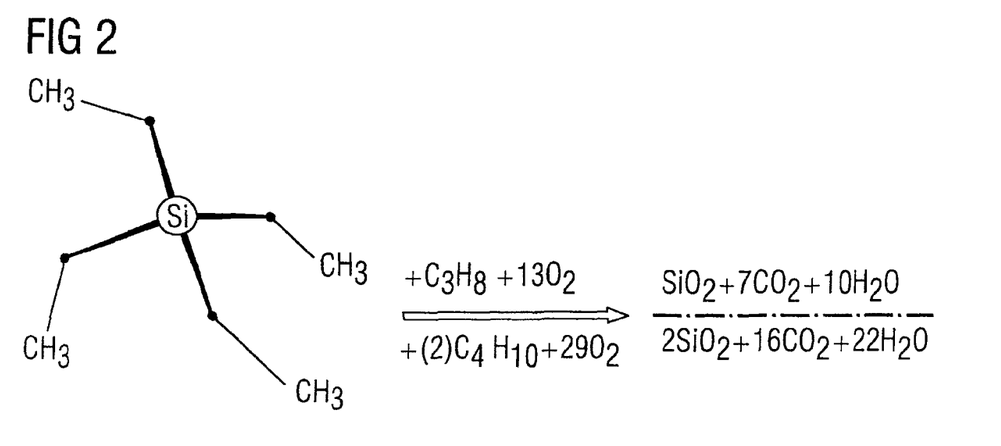
FIG. 2 shows a reaction scheme of a flame-pyrolytic coating of surfaces of semiconductor device components with a first adhesion promoter layer comprising silicates.

FIG. 2 shows a reaction scheme of a flame-pyrolytic coating of surfaces of semiconductor device components with an adhesion promoter comprising silicates. In order to form such silicates as $SiO_x$, an organometallic compound in the form of a tetramethyl silane and derivatives of the tetramethyl silane, preferably tetraethylene silane, which has an empirical formula of $SiC_4H_{12}$, is fed to a flame coating installation. The tetraethylene silane has a central Me atom in the form of a silicon atom Si surrounded by four organic ethyl molecules —$CH_3$, as is shown on the left-hand side of FIG. 2.

In the coating installation, the tetraethylene silane $SiC_4H_{12}$ is mixed, e.g., with a propane gas having the empirical formula $C_3H_8$ and with oxygen $13O_2$ and burned, in which case, as reaction products, volatile carbon dioxide $7CO_2$ and water $10H_2O$ arise and $SiO_x$ silicates, preferably silicon dioxide $SiO_2$, deposit on the surface of the semiconductor device component to be coated. FIG. 2 illustrates, separated by a dash-dotted line, a further reaction possibility in which butane having the empirical formula $C_4H_{10}$ is fed in instead of the propane having an empirical formula $C_3H_8$. In this case, two tetraethylene silane molecules can react with two butane molecules and twenty-nine $O_2$ molecules to form depositing $SiO_x$ silicate and to form the volatile carbon dioxide $16CO_2$ and also to form volatile water $22H_2O$ in the butane flame. Instead of butane $C_4H_{10}$, it is also possible to use methane having the empirical formula $CH_4$ for the flame pyrolysis.

This uniform deposition of the first adhesion promoter layer 10 may be effected in a flame tube or via drawing the ready mounted semiconductor device components 3 through a flame ring, the residence duration in the region of the flame tube or the flame ring being only a few seconds. In the case of a semiconductor device 1, the external leads 13 (shown in FIG. 3), which are not intended to be provided with an adhesion promoter layer, are protected against coating in the flame tube or the annular burner by the application of a protective layer.

Via flame pyrolysis of this type, an $SiO_x$ layer is deposited as an adhesion promoter layer on the semiconductor device components introduced. The required average layer thickness is only 5 to 40 nm and may be deposited up to 300 nm if necessary. Heating of the semiconductor device components can be reduced to less than 100° C. via a periodic coating process. The effective flame exposure time is within the seconds range. Flame coating of this type is also simultaneously associated with surface cleaning and surface activation, so that the deposited silicates bond closely with the—in this case—metallic surface. The liberated reaction products, such as silicon dioxide in amorphous form, and also the volatile water and the volatile carbon dioxide, can be disposed of in an environmentally friendly manner to the greatest possible extent via the volatile components being introduced into water and the excess silicon dioxide being collected or precipitated.

Figure 3:
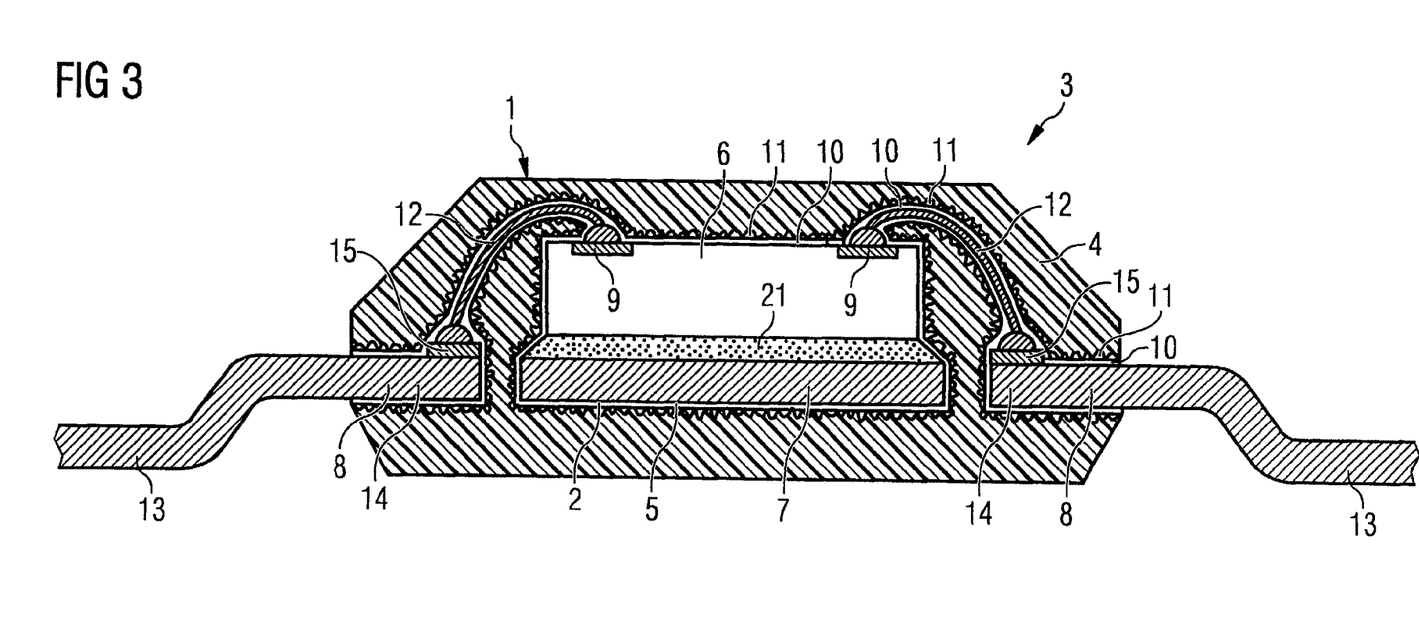
FIG. 3 shows a schematic cross section through the semiconductor device from FIG. 1 with semiconductor device components whose surfaces have two adhesion promoter layers.

FIG. 3 shows a schematic cross section through the semiconductor device 1 comprising semiconductor device components 3 whose surfaces comprise the adhesion promoter structure 2 according to FIG. 1. In the case of this semiconductor device 1, in order to enhance the surface adhesion between the surfaces of the semiconductor device components 3 and the plastic housing composition 4, all the semiconductor device components 3 have been provided with a flame-pyrolytic adhesion promoter layer 10 as first adhesion promoter layer after their assembly on the leadframe 5.

The second adhesion promoter layer 11 is arranged on the first adhesion promoter layer 10. The second adhesion promoter layer 11 comprises polymers and provides a good adhesion between the adhesion promoter structure 2 and also the coated components 3 and the epoxy resin of the plastic housing composition 4. The adhesion promoter structure 2 is arranged not only on metallic surfaces of the internal leads 14 and of the bonding wires 12, but also on the surfaces of the semiconductor chip 6 and the chip contact areas 9 thereof.

The adhesion promoter structure 2 may comprise a nanoporous morphology in the topmost region. The first adhesion promoter layer 10 is deposited with a nanoporous morphology via flame pyrolysis. The morphology is adopted at least partly by the second adhesion promoter layer 11 applied thereon.

The nanoporous morphology of the adhesion promoter layer 2 supports the interlocking with a plastic housing composition to be applied to the surface. Moreover, the nanoporous morphology of the adhesion promoter layer 2 promotes the formation of chemical bridges between the plastic housing composition 4 and the adhesion promoter structure 2. In this case, the adhesion promoter layer 2 forms an amorphous structure with a high proportion of free volume, which superficially penetrates the plastic housing composition 4 and thus forms an elastic transition layer between the semiconductor device components 3 and the plastic housing composition 4. The transition layer between the nanoporous morphology of the adhesion promoter structure 2 and the plastic housing composition 4 can provide compensation of the coefficients of thermal expansion between the metallic system carrier material and the polymeric plastic of the plastic housing composition.

Figure 4:
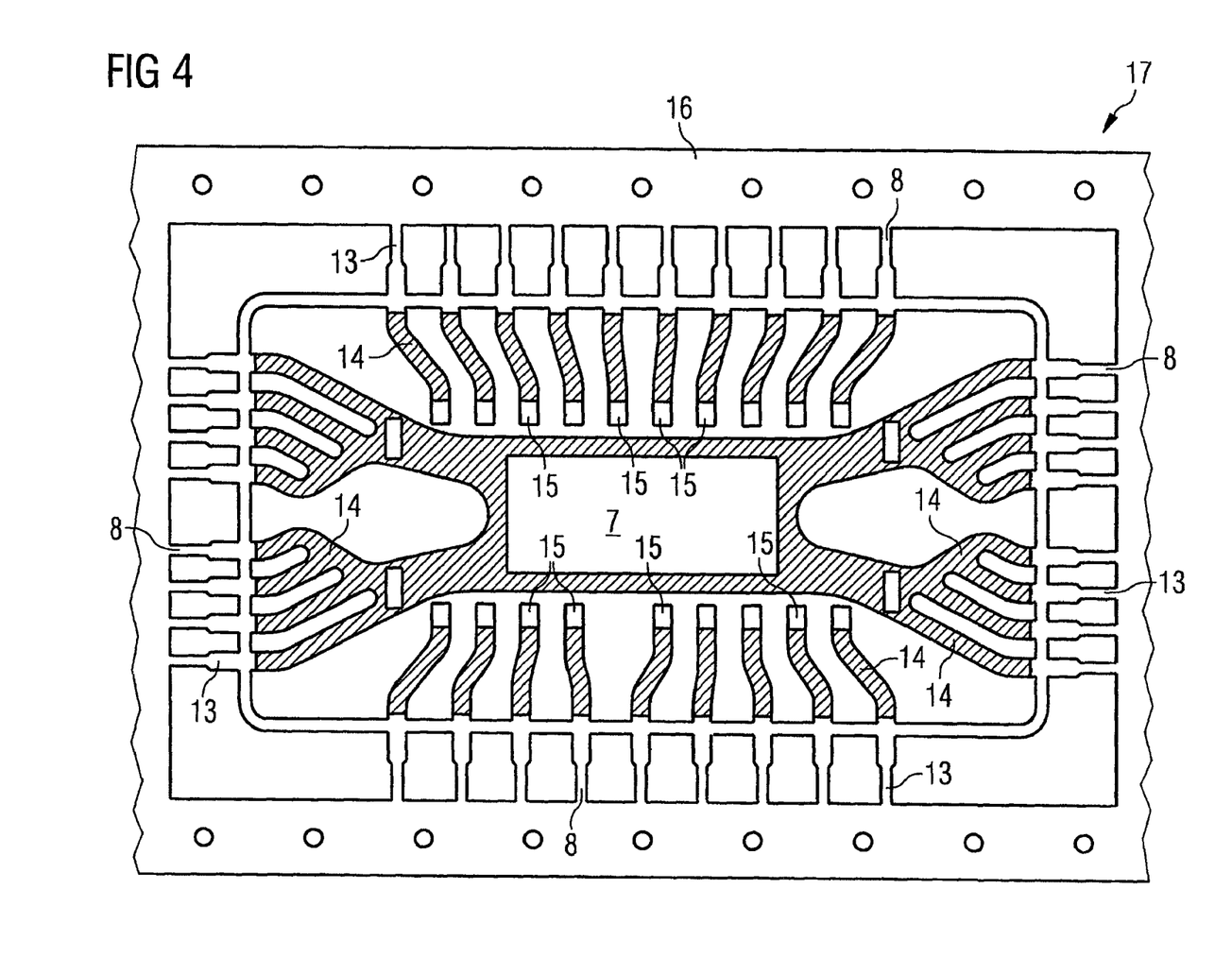
FIG. 4 shows a schematic plan view of a metallic system carrier whose surface is partly provided with two adhesion promoter layers.

In a further embodiment of the described device, which is shown in FIG. 4, the substrate carrier or leadframe 5 is also subjected to a flame pyrolysis prior to the assembly of the semiconductor device components 3, but care must then be taken to ensure that both the external leads 13 and the inner contact areas 15 of the leadframes 5 remain free of the coating. An advantage of this process is that this is a coating process which is easy to handle and which can be applied on all sides to the surfaces of the semiconductor devices that are to be anchored.

FIG. 4 shows a schematic plan view of a metallic system carrier 16 whose surfaces are partly provided with an adhesion promoter structure 2 according to the described device. The system carrier 16 is based on a lead strip 16 comprising a plurality of semiconductor device positions 17, each semiconductor device position 17 providing a leadframe 5 for a semiconductor device. The surfaces of the internal leads 14 are covered, apart from the contact areas 15, with the two layers 10, 11 of the adhesion promoter structure 2 according to the described device, which is illustrated by the hatching of the corresponding areas.

The contact areas 15, which are kept free of the adhesion promoter layer 2, are provided for fitting connection elements in the form of bonding wires. The internal leads 14 provided with an adhesion promoter layer 2 merge into external leads 13 without adhesion promoter structure 2.

In a further embodiment that is not shown here, the chip islands 7 may be completely coated with the adhesion promoter structure 2. This has an advantage of enhancing the adhesion between the top side of the chip island 7 and the adhesive 21 via which the semiconductor chip 2 is mounted on the chip island 7.

Figure 5:
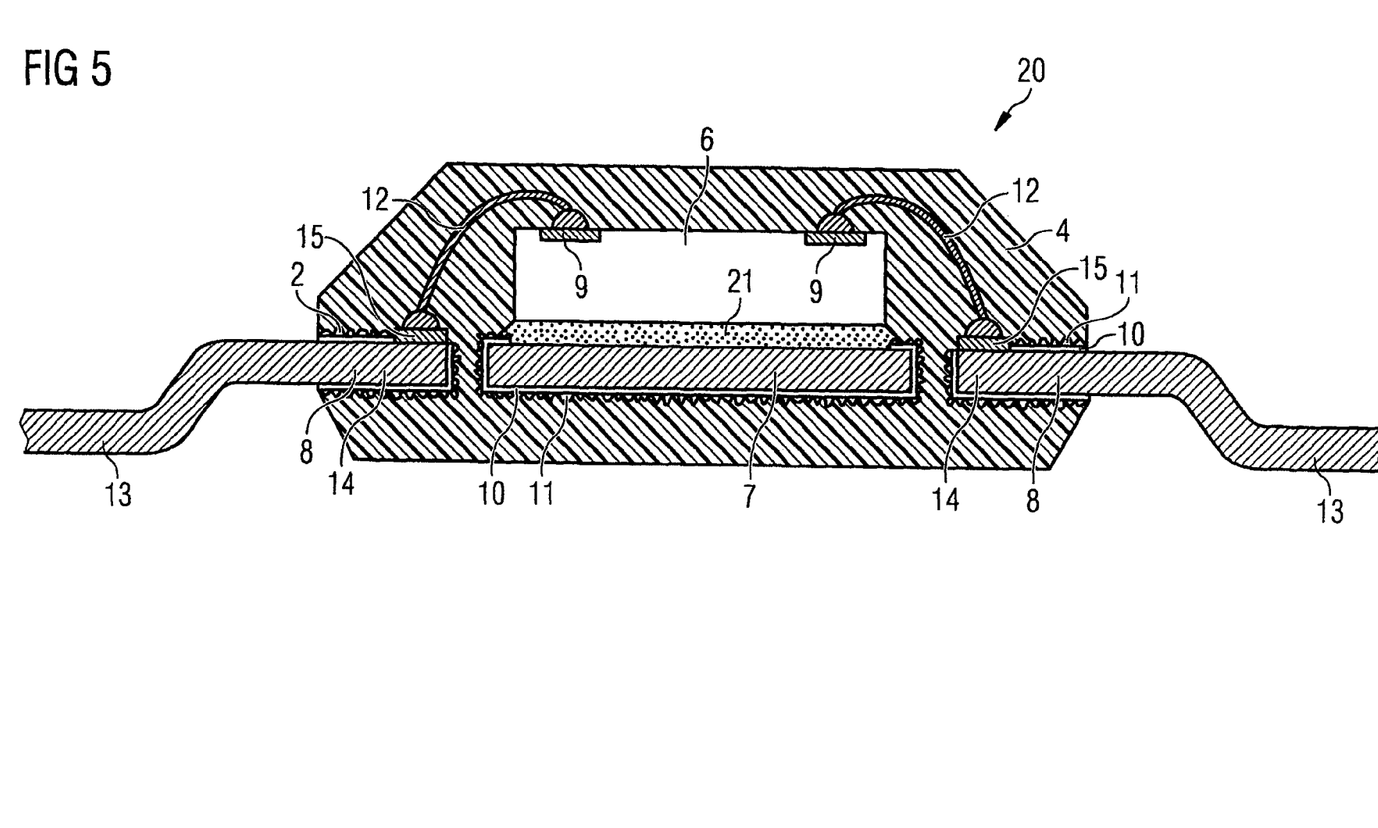
FIG. 5 shows a schematic cross section of a semiconductor device comprising the system carrier from FIG. 4.

FIG. 5 shows a schematic cross section through a semiconductor device 20 comprising the system carrier 16 from FIG. 4. In this exemplary embodiment, the surfaces of the leadframe 5 which are arranged within the plastic housing composition 4 have an adhesion promoter structure 2. According to the described device, the adhesion promoter structure 2 comprises a first, inorganic layer 10 made of silicates, which is arranged directly on the leadframe 5, and a second adhesion promoter layer 11, which comprises a polymer and is arranged on the first adhesion promoter layer 10. The second adhesion promoter layer 11 is in direct contact with the plastic housing composition 4 and the first adhesion promoter layer 10.

The adhesion promoter structure 2 is applied on the internal lead 14 and also the chip island 7 of the leadframe 5 prior to the mounting of the semiconductor chip 6 and the production of the bonding wire connections 12. After the application of the two layers 10, 11 of the adhesion promoter structure 2, the semiconductor chip 6 is fixed on the chip island 7 of the leadframe 5 via an adhesive layer 21. Bonding wires 12 are then produced between the chip contact areas 9 of the semiconductor chip 6 and the contact areas 15 of the internal leads 14 in order to electrically connect the semiconductor chip 6 to the leads 8. The semiconductor chip 6, bonding wires 12 and internal leads 14 are embedded in the plastic composition 4. The surfaces of the bonding wires 12 and of the semiconductor chip 6 are thus free of the adhesion promoter structure 2.

The semiconductor device 20 according to this embodiment of the described device has an advantage that leadframes 5 are coated with the adhesion promoter layers 10, 11. The coated leadframe 5 can be used in the known production method for constructing the semiconductor device 20. An improved interlocking between the metallic leadframe 5 and the plastic composition 4 is provided without the production method requiring considerable modification.

Comparative experiments were carried out in order to examine the reliability of the adhesion promoter structure according to the described device and method. Semiconductor devices with a known SOT223 housing, i.e., (Small Outline Transistor package), were produced. A first group were provided with an adhesion promoter layer made of silicates. This adhesion promoter layer was deposited via flame pyrolysis on all the surfaces of the components of the device which are intended to be embedded into the plastic housing composition.

A second group of devices was produced, the devices comprising, according to the described method, a first adhesion promoter layer made of pyrolytically deposited silicates and a second adhesion promoter layer made of polymers that is applied thereto and is arranged between the silicate adhesion promoter layer and the plastic housing composition.

The reliability of the devices in the two groups was examined. The two groups were subjected to the known Moisture Sensitivity Level 1 (MSL1) criteria, heated three times to 260° C., as is customary in a soldering process, and were subjected one hundred times to between −55° and 150° C., in order to ascertain the aftereffect of thermal cycling.

Ultrasonic examinations of the devices in the two groups were carried out in order to determine cracks in the device housings. The results of the ultrasonic examinations show that the second group comprising the additional second adhesion promoter layer made of polymers has few cracks and withstood the loading better than the first group comprising only one adhesion promoter layer made of silicates.

While the device and method have been described in detail with reference to specific embodiments thereof, it will be apparent to one of ordinary skill in the art that various changes and modifications can be made therein without departing from the spirit and scope thereof. Accordingly, it is intended that the described device and method cover the modifications and variations provided they come within the scope of the appended claims and their equivalents.

What is claimed is:

1. A semiconductor device, comprising:
a plurality of semiconductor device components embedded in a plastic housing composition; and
an adhesion promoter structure with nanoporous morphology, the adhesion promoter structure being disposed between the semiconductor device components and the plastic housing composition such that all exposed structural surfaces disposed within the plastic housing composition including an entire surface of each the semiconductor device components are covered by the adhesion promoter structure;
wherein the adhesion promoter structure comprises:
a first adhesion promoter layer comprising metal oxides of a reactive compound including oxygen and organometallic molecules, the first promoter layer having an average thickness $D_1$, where $1\ nm \leq D_1 \leq 1\ \mu m$; and
a second adhesion promoter layer comprising at least one polymer;
wherein the first adhesion promoter layer is disposed on the semiconductor device components and the second adhesion promoter layer is disposed on the first adhesion promoter layer.

2. The semiconductor device of claim 1, wherein the first adhesion promoter layer comprises at least one oxide, the at least one oxide including at least one element selected from the group consisting of Al, B, Ce, Co, Cr, Ge, Hf, In, Mn, Mo, Nb, Nd, Ni, Pb, Pr, Pt, Rb, Re, Rh, Ru, Sb, Sc, Si, Sm, Sn, Sr, Ta, Te, Th, Ti, Tl, Tm, U, V, W, Yb, Zr and Zn.

3. The semiconductor device of claim 1, wherein the first adhesion promoter layer further comprises nanoscale silicate compounds.

4. The semiconductor device of claim 1, wherein the first adhesion promoter layer is formed via pyrolytic deposition.

5. The semiconductor device of claim 1, wherein the polymer of the second adhesion promoter layer comprises terminal groups oriented toward the plastic housing composition and terminal groups oriented toward the first adhesion promoter layer.

6. The semiconductor device of claim 1, wherein the second adhesion promoter layer comprises at least one polymer selected from the group consisting of polyimides, polyisocyanates, polyamidocarboxylic esters of polyamide-silicone block copolymers, polyamide imides including silanes, and polyimide-silicone copolymers including silanes.

7. The semiconductor device of claim 6, wherein:
the second adhesion promoter layer is formed from a 10 percent by weight solution of a fluorinated polyimide comprising 2,2-bis [phenyl-3',4'-dicarboxylic anhydride]-1,1,1,3,3,3-hexafluoropropylene and 3,3',5,5'-tetramethyl-4,4'-diaminodiphenylmethane in one of:
γ-butyrolactone and cyclopentanone with a weight ratio of γ-butyrolactone:cyclopentanone being 1:2; and
N-Methylpyrrolidone (NMP) and cyclopentanone with a weight ratio of NMP:cyclopentanone being 1:2; and
the second adhesion promoter layer is selectively applied to the semiconductor device, prior to encapsulation of the device, via a suitable dispensing apparatus such that a layer thickness d of the second adhesion promoter layer is achieved, where $0.5\ \mu m \leq d \leq 1.0\ \mu m$.

8. The semiconductor device of claim 6, wherein the second adhesion promoter layer further comprises:
polyamide imide with acid groups having been condensed with amino groups of a silane such that every 2nd to 10th free acid group of the polyamide imide has reacted chemically with an amino group of a silane.

9. The semiconductor device of claim 6, wherein the second adhesion promoter layer further comprises:
a polyamide imide-silicone copolymer with silanes in the polymer chain and with acid groups of the polyamide imide having been condensed with amino groups of a silane such that every 2nd to 10th free acid group of the polyamide imide have been reacted chemically with an amino group of a silane.

10. The semiconductor device of claim 1, wherein the second adhesion promoter layer further comprises a compound selected from the group consisting of imidazoles, liquid-crystalline polymers, high-temperature-resistant thermoplastics, phenolic resins, amino resins, siloxanes, unsaturated polyesters, polybenzoxazoles, polybenzimidazoles, epoxides, polyurethanes, polymers including sulfur, and mixtures thereof.

11. The semiconductor device of claim 1, wherein the second adhesion promoter layer further comprises at least one functional group selected from the group consisting of sulfone groups, mercapto groups, amino groups, carboxyl groups, cyano groups, keto groups, hydroxyl groups, silano groups and titano groups.

12. The semiconductor device of claim 1, wherein the second adhesion promoter layer is formed with a polymer precursor comprising at least one copolymer or a mixture including two or more polymers.

13. The semiconductor device of claim 1, wherein the second adhesion promoter layer further comprises at least one additive selected from the group consisting of solvents, adhesion promoters, antioxidants, catalysts, reinforced fillers, plasticizers and UV stabilizers.

14. The semiconductor device of claim 1, wherein the first adhesion promoter layer has an average thickness $D_1$, where $1\ nm \leq D_1 \leq 300\ nm$.

15. The semiconductor device of claim 1, wherein the second adhesion promoter layer has an average thickness $D_2$, where $100\ nm \leq D_2 20\ \mu m$.

16. The semiconductor device of claim 1, wherein at least one of the semiconductor device components includes a wiring substrate with a structured metal coating.

17. The semiconductor device of claim 1, wherein at least one of the semiconductor device components includes a ceramic substrate with structured metal layers.

18. The semiconductor device of claim 1, wherein at least one of the semiconductor device components includes a printed circuit board with a structured metal coating.

19. The semiconductor device of claim 1, wherein at least one of the semiconductor device components comprises internal leads which merge into external leads forming external contacts outside the plastic housing composition.

20. The semiconductor device of claim 1, wherein at least one of the semiconductor device components is a semiconductor chip.

21. The semiconductor device of claim 1, wherein at least one of the semiconductor device components includes a plurality of connection elements including at least one of inner flip-chip contacts and bonding connection wires.

22. A system carrier including a plurality of semiconductor components, the system carrier comprising:
a plurality of semiconductor device positions arranged in rows and/or columns and suitably configured to receive semiconductor device components, the semiconductor device positions including a spatial wiring structure with chip pads to receive semiconductor chips and contact pads to facilitate electrical connections to chip contact areas of the semiconductor chips; and
an adhesion promoter structure with nanoporous morphology, the adhesion promoter structure being selectively disposed on all exposed surfaces of the system carrier to be embedded within a plastic housing composition with the exception that the contact pads are free of the adhesion promoter structure;
wherein the adhesion promoter structure comprises first and second adhesion promoter layers, the first adhesion promoter layer comprising metal oxides of a reactive compound comprising oxygen and organometallic molecules and having an average thickness $D_1$, where $1\ nm \leq D_1 \leq 1\ \mu m$, the second adhesion promoter layer comprising one or more polymers, the first adhesion promoter layer is disposed on the semiconductor device components, and the second adhesion promoter layer is disposed on the first adhesion promoter layer.

* * * * *

UNITED STATES PATENT AND TRADEMARK OFFICE
CERTIFICATE OF CORRECTION

| | | |
|---|---|---|
| PATENT NO. | : 7,705,472 B2 | Page 1 of 1 |
| APPLICATION NO. | : 11/612738 | |
| DATED | : April 27, 2010 | |
| INVENTOR(S) | : Joachim Mahler et al. | |

It is certified that error appears in the above-identified patent and that said Letters Patent is hereby corrected as shown below:

On the Title page of the patent, in section (75) Inventors:, replace the third inventor's name "Dieter Lachman" with -- Dieter Lachmann --.

Signed and Sealed this
Twenty-seventh Day of December, 2011

David J. Kappos
*Director of the United States Patent and Trademark Office*